(12) United States Patent
Huo et al.

(10) Patent No.: US 12,745,673 B2
(45) Date of Patent: Sep. 22, 2026

(54) LED MODULE, LED SOURCE SUBSTRATE, DISPLAY PANEL, AND DISPLAY APPARATUS

(71) Applicant: Shanghai Tianma Micro-Electronics Co., Ltd., Shanghai (CN)

(72) Inventors: Sitao Huo, Shanghai (CN); Yuan Ding, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 1043 days.

(21) Appl. No.: 17/859,983

(22) Filed: Jul. 7, 2022

(65) Prior Publication Data

US 2022/0344312 A1 Oct. 27, 2022

(30) Foreign Application Priority Data

Nov. 17, 2021 (CN) ........................ 202111361889.2

(51) Int. Cl.

| | |
|---|---|
| ***H10W 90/00*** | (2026.01) |
| ***H10H 20/813*** | (2025.01) |
| ***H10H 20/815*** | (2025.01) |
| ***H10H 20/821*** | (2025.01) |
| ***H10H 20/83*** | (2025.01) |
| ***H10H 29/14*** | (2025.01) |

(52) U.S. Cl.

CPC .......... *H10W 90/00* (2026.01); *H10H 20/813* (2025.01); *H10H 20/815* (2025.01); *H10H 20/821* (2025.01); *H10H 20/83* (2025.01); *H10H 29/142* (2025.01)

(58) Field of Classification Search

CPC ... H10W 90/00; H10H 20/813; H10H 20/815; H10H 20/819; H10H 20/821; H10H 29/10–49; H10P 54/00; H10P 58/00; H10K 71/851

See application file for complete search history.

(56) References Cited

U.S. PATENT DOCUMENTS

| | | | | |
|---|---|---|---|---|
| 11,955,064 | B1 * | 4/2024 | Bonart | H01L 25/0753 |
| 2021/0343780 | A1 * | 11/2021 | Long | H10H 20/831 |
| 2022/0271101 | A1 * | 8/2022 | Bing | H10K 59/353 |
| 2022/0336706 | A1 * | 10/2022 | Ma | H10H 20/01 |
| 2023/0105156 | A1 * | 4/2023 | Qu | H10H 20/84 257/79 |

FOREIGN PATENT DOCUMENTS

| | | | | |
|---|---|---|---|---|
| CN | 107910346 | A * | 4/2018 | H10H 20/83 |
| CN | 109037270 | A * | 12/2018 | H10H 29/142 |
| CN | 109213361 | A | 1/2019 | |
| CN | 113380937 | A * | 9/2021 | H10H 20/857 |
| CN | 113540302 | A | 10/2021 | |

OTHER PUBLICATIONS

Chinese First Office Action (with English translation) for Chinese Application No. 202111361889.2, filed Nov. 17, 2021; 19 pages total.

* cited by examiner

*Primary Examiner* — Christine S. Kim
*Assistant Examiner* — Tien Tran
(74) *Attorney, Agent, or Firm* — Christensen O'Connor Johnson Kindness PLLC

(57) ABSTRACT

An LED module, an LED source substrate, a display panel, and a display apparatus are provided. The LED module includes N LED chips. N is an integer not smaller than 2. The N LED chips share one first electrode. At least two of the N LED chips each include a second electrode.

18 Claims, 9 Drawing Sheets

10

30

20

LED MODULE, LED SOURCE SUBSTRATE, DISPLAY PANEL, AND DISPLAY APPARATUS

CROSS-REFERENCE TO RELATED APPLICATION

The present application claims priority to Chinese Patent Application No. 202111361889.2, filed on Nov. 17, 2021, the content of which is incorporated herein by reference in its entirety.

TECHNICAL FIELD

The present disclosure relates to the field of display technologies, and, particularly, relates to a light-emitting diode (LED) module, an LED source substrate, a display panel, and a display apparatus.

BACKGROUND

A light-emitting diode (LED) as a light-emitting device is widely used in the display field. In the traditional liquid crystal display field, LEDs are used as light sources in backlight bars. With the development of technologies, the size of LED chips has gradually become smaller, so that small-sized LED chips, such as mini LED, micro LED, and nano LED have appeared. The entire plane arrangement of mini LEDs can be used as the backlight source in the liquid crystal display panel, and smaller-sized LED chips, such as micro LEDs, nano LEDs, and the like can be used as pixels in the display panel.

Due to the limitations of the manufacturing process, LED chips need to be grown on a wafer and then transferred to a specific substrate using a massive transfer technology. The number of LED chips transferred in each massive transfer process is huge, resulting in a certain yield in the massive transfer process. The large number of transfers further affects the yield of the LED chips on the panel. A lower yield may cause difficulty in repairing, a longer production cycle, and high costs.

SUMMARY

In a first aspect of the present disclosure, an LED module is provided. The LED module includes N LED chips, where N is an integer not smaller than 2. The N LED chips share one first electrode, and each of at least two of the N LED chips includes a second electrode.

In a second aspect of the present disclosure, an LED source substrate is provided. The LED source substrate includes a plurality of LED modules, and each of the plurality of LED modules is the LED module provided in the first aspect.

In a third aspect of the present disclosure, a display panel is provided. The display panel includes a plurality of pixels including at least one first-color pixel, at least one second-color pixel, and at least one third-color pixel. Each of at least one of the plurality of pixels includes the LED module provided in the first aspect. Each of the at least one of the plurality of pixels includes a plurality of sub-pixels, and a number of the plurality of sub-pixels is the same as a number of the N LED chips of the LED module of the pixel.

In a fourth aspect of the present disclosure, a display apparatus is provided. The display apparatus includes the display panel provided in the third aspect.

BRIEF DESCRIPTION OF DRAWINGS

In order to more clearly explain the embodiments of the present disclosure or the technical solution in the related art, the drawings to be used in the description of the embodiments or the related art will be briefly described below. The drawings in the following description are some embodiments of the present disclosure. For those skilled in the art, other drawings may also be obtained based on these drawings.

DESCRIPTION OF EMBODIMENTS

In order to more clearly illustrate objectives, technical solutions, and advantages of the embodiments of the present disclosure, the technical solutions in the embodiments of the present disclosure are clearly and completely described in details with reference to the accompanying drawings. The described embodiments are merely part of the embodiments of the present disclosure rather than all of the embodiments. All other embodiments obtained by those skilled in the art based on the embodiments of the present disclosure shall fall into the protection scope of the present disclosure.

The terms used in the embodiments of the present disclosure are merely for the purpose of describing specific embodiments, rather than limiting the present disclosure. The terms “a”, “an”, “the” and “said” in a singular form in the embodiments of the present disclosure and the attached claims are also intended to include plural forms thereof, unless noted otherwise.

In the related art, LED chips need to be grown on a wafer and then transferred to a specific substrate using a massive transfer technology. When being applied in a display panel, LED chips emitting red light, LED chips emitting green light, and LED chips emitting blue light need to be transferred separately, and the number of LED chips transferred in each transfer process is huge. Both the efficiency and the transfer yield of the massive transfer of LED chips have a greater impact on the production cost of the panel.

In the present disclosure, the structure of the LED chip is redesigned to reduce the influence of the large number of transfers in the related art on the yield of the LED chip of the panel, and reduce the production cost of the display panel. The present disclosure proposes an LED module including at least two LED chips. When a massive transfer is performed, one LED module is used as a minimum unit for transfer, in case that the total number of minimum units transferred for each massive transfer is fixed, the number of LED chips transferred in each massive transfer process can be increased. Therefore, when the number of times of transfers can be reduced without substantially affecting the display effect of the display panel, when the transfer yield is determined, the number of LED defective products can be reduced, the number of repairs to the LED can be reduced, thereby shortening production time and reducing costs.

In an embodiment of the present disclosure, an LED module includes N LED chips, and N is an integer not less than 2. The N LED chips share one first electrode. At least two LED chips each include a second electrode. In an embodiment of the present disclosure, the LED chip has a size smaller than or equal to 200 μm.

Figure 1:
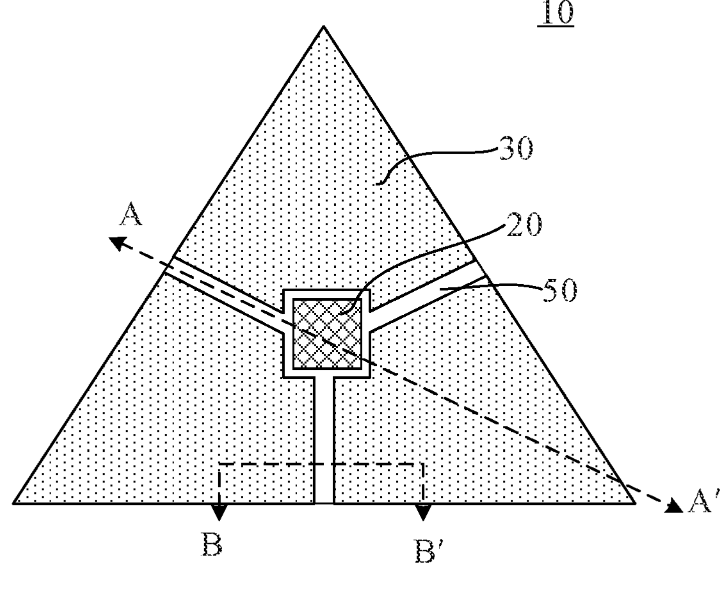
FIG. 1 is a top view of an LED module according to an embodiment of the present disclosure.
Figure 2:
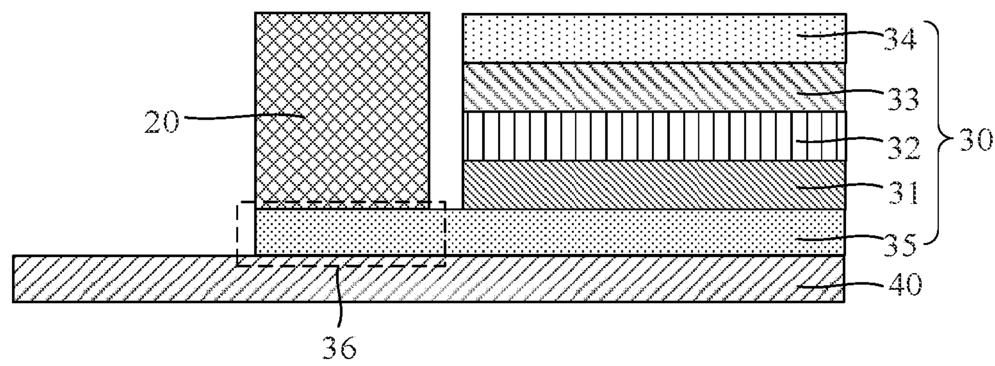
FIG. 2 is a cross-sectional view along a line A-A' shown in FIG. 1 according to an embodiment of the present disclosure.

Taking N=3 as an example, FIG. 1 is a top view of an LED module according to an embodiment of the present disclosure, and FIG. 2 is a cross-sectional view along a line A-A' shown in FIG. 1 according to an embodiment of the present disclosure.

Referring to FIG. 1 and FIG. 2, the LED module 10 includes a first electrode 20 and three LED chips 30. The LED chip 30 at least includes a p-type semiconductor layer 31, a light-emitting layer 32, and an n-type semiconductor layer 33. The first electrode 20 is a common electrode. Each LED chip 30 includes a second electrode 34.

FIG. 1 is equivalent to a top view of the LED module, and the shape of the first electrode 20 shown in FIG. 1 is only a schematic representation. In order to ensure the contact area between each LED chip 30 and the first electrode 20, the shape of the first electrode 20 can be designed according to specific design requirements. The shape of the first electrode 20 in the top view can be a circle, a rectangle, or other shape.

The present disclosure provides an LED module. The LED module includes at least two LED chips. The LED chips of the LED module share one electrode, so that the LED module can be used as an integrated structure, and each LED chip of the LED module can be driven alone to light up according to application scenarios. When being applied to a display panel including the LED module, the LED module can be transferred as one minimum unit in the massive transfer process during production. In case that the total number of minimum units transferred for each massive transfer is fixed, the number of LED chips transferred by each massive transfer can be increased. After the multiple LED modules with different light-emitting colors are transferred to the predetermined positions of the driving substrate, the LED chips with different light-emitting colors are recombined to be displayed as a display module. Therefore, when the number of transfers can be reduced without substantially affecting the display effect of the display panel, when the transfer yield is determined, the number of repairs to the LED can be reduced, thereby shortening production time and reducing costs.

In an embodiment of the present disclosure, the LED module further includes a substrate. The N LED chips are located at a same side of the substrate. The LED chip includes a buffer layer. The first electrode is electrically connected to the buffer layer. The substrate 40 is shown in FIG. 2. The LED chip 30 is located at a side of the substrate 40. The LED chip 30 includes a first buffer layer 35. The first buffer layer 35, the light-emitting layer 32, and the second electrode 34 are sequentially arranged away from the substrate 40. The first electrode 20 is electrically connected to the first buffer layer 35. After voltages are applied to the first electrode 20 and the second electrode 34, respectively, the light-emitting layer 32 can be driven to emit light, and the corresponding LED chip 30 is lit. The first buffer layers 35 in each LED chip 30 are all electrically connected to the first electrode 20, so that the LED chips 30 share the first electrode 20 and thus the LED module can be used as an integrated structure. The arrangement of the LED chips is more compact, and the size of the LED module can be reduced to a certain extent.

As shown in FIG. 2, the p-type semiconductor layer 31, the light-emitting layer 32, the n-type semiconductor layer 33, and the second electrode 34 are arranged sequentially on the first buffer layer 35. The first buffer layer 35 is electrically connected to the first electrode 20, and the p-type semiconductor 31 is located at a side of the first buffer layer 35 away from the substrate 40, so that the p-type semiconductor 31 and the first buffer layer 35 are in surface contact to achieve a larger contact between the p-type semiconductor and the first buffer layer 35, thereby ensuring the light-emitting performance of the LED chip 30.

In an embodiment of the present disclosure, as shown in FIG. 2, the p-type semiconductor layer 31 is connected to the first electrode 20 through the first buffer layer 35, and the n-type semiconductor layer 33 is in contact with and connected to the second electrode 34. That is, the second electrode 34 is a cathode, and the first electrode 20 is an anode. Multiple LED chips 30 of the LED module share one anode.

In another embodiment, multiple LED chips 30 of the LED module shares one cathode, and each LED chip 30 further includes one anode.

In some embodiments, as shown in FIG. 2, the LED module further includes a common buffer layer 36 located at a side of the substrate 40. The first electrode 20 is in contact with a surface of the common buffer layer 36 away from the substrate 40. The first buffer layers 35 of the N LED chips 30 of the LED module are all connected to the common buffer layer 36. In an embodiment, the first buffer layer 35 of the LED chip 30 is connected to the first electrode 20 through the common buffer layer 36, so that the LED chip 30 can share the first electrode 20.

Figures 3, 4, 5:
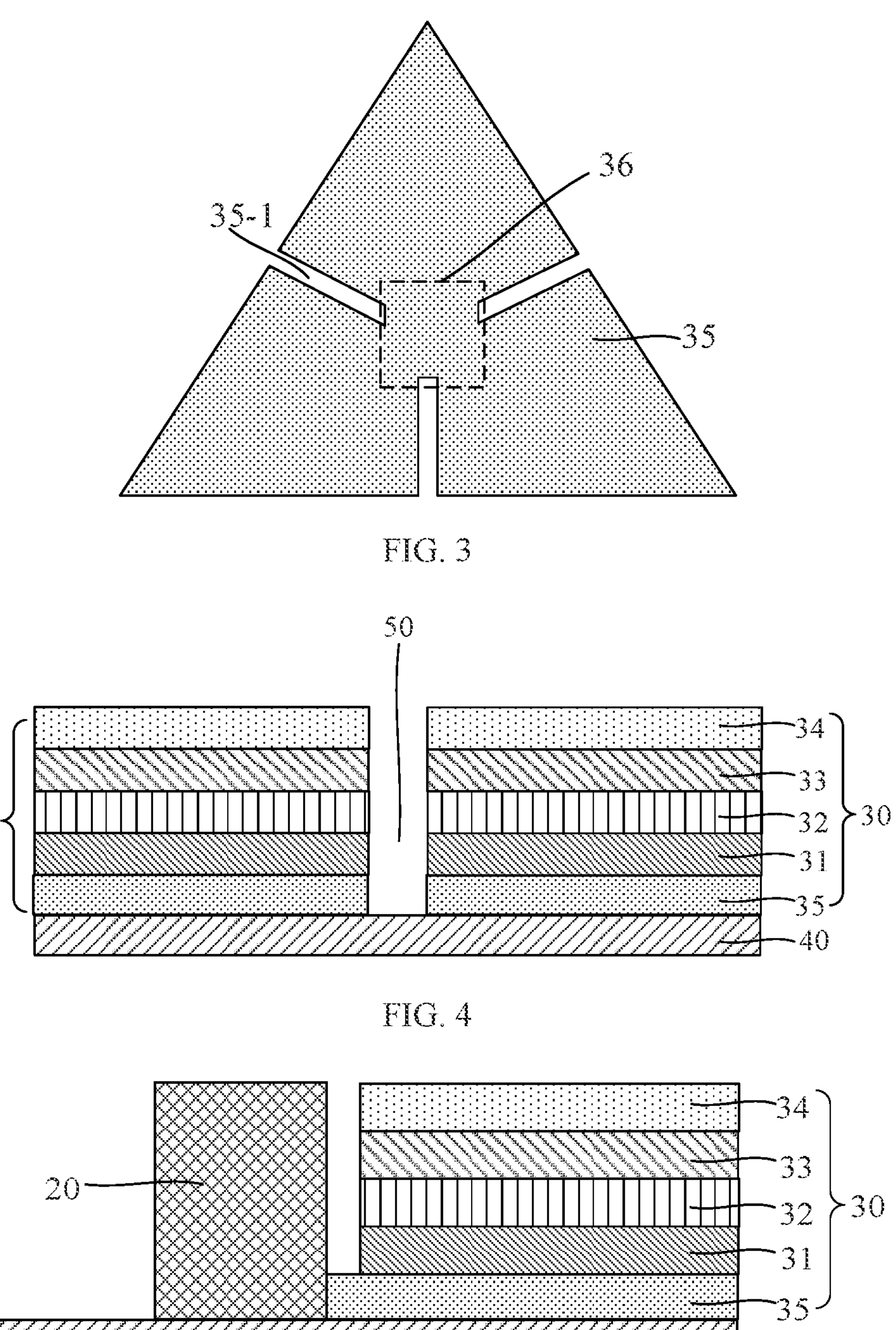
FIG. 3 is a top view of a buffer layer in an LED module according to an embodiment of the present disclosure.
FIG. 4 is a cross-sectional view along a line B-B' shown in FIG. 1 according to an embodiment of the present disclosure.
FIG. 5 is another cross-sectional view along a line A-A' shown in FIG. 1 according to an embodiment of the present disclosure.

In some embodiments, the first buffer layer 35 and the common buffer layer 36 are formed into one piece. FIG. 3 is a top view of a buffer layer in an LED module according to an embodiment of the present disclosure. As shown in FIG. 3, the buffer layer is a patterned structure, each LED chip corresponds to the first buffer layer 35, and the first buffer layer 35 is connected to the common buffer layer 36. In an embodiment, the first buffer layer 35 and the common buffer layer 36 are manufactured in the same process. The first buffer layer 35 and the common buffer layer 36 are divided according to their respective positions. When it is manufactured, the p-type semiconductor layer 31, the light-emitting layer 32, the n-type semiconductor layer 33, and the second electrode 34 of the LED chip 30 are sequentially manufactured in a region corresponding to the first buffer layer 35. The first buffer layer 35 is a part of the LED chip 30. The first electrode 20 is manufactured in a region where the common buffer layer 36 is located.

In an embodiment of the present disclosure, N=3 is taken as an example. As shown in FIG. 1, three LED chips 30 surround the first electrode 20. To understand with reference to FIG. 2, in an embodiment of the present disclosure, an orthographic projection of the first buffer layer 35 of the LED chip 30 on the substrate 40 surrounds an orthographic projection of the first electrode 20 on the substrate 40. The first electrode 20 is arranged in the middle, and various LED chips 30 are arranged around the first electrode 20, so that the electrical connection between the first buffer layer 35 and the first electrode 20 in each LED chip 30 can be achieved, and LED chips 30 share the first electrode 20. The arrangement of the LED chips 30 of the LED module can be more compact, and the overall size of the LED module can be reduced to a certain extent. When the LED module is applied in the display panel, the aperture ratio of the display panel can be increased, and the light transmittance of the display panel can be increased in some applications.

FIG. 4 is a cross-sectional view along a line B-B' shown in FIG. 1 according to an embodiment of the present disclosure. In some embodiments, referring to FIG. 1 and FIG. 4, an isolation groove 50 is arranged between two adjacent LED chips 30 and is configured to separate adjacent LED chips 30 so that the LED chips 30 are independent of each other. It can be seen from FIG. 4 that in a direction e perpendicular to a plane where the substrate 40 is located, the first buffer layer 35 does not at least partially overlap with the isolation groove 50. In some embodiments, no buffer layer is provided at the isolation groove 50, in other words, the isolation groove 50 passes through the buffer layer of the LED module. It can also be seen from FIG. 3 that there is a notch 35-1 between the adjacent first buffer layers 35. The notch 35-1 corresponds to the location of the isolation groove 50. In an embodiment of the present disclosure, the first buffer layer 35 of the LED chip 30 is electrically connected to the first electrode 20, and the first buffer layers 35 between adjacent LED chips 30 are not at least partially in contact with each other, so that a risk of mutual interference between the adjacent LED chips 30 can be reduced, and each LED chip 30 can be lit independently.

In some embodiments, the first buffer layers 35 in the LED chips 30 are connected to each other, and a buffer layer is provided at the isolation groove 50, that is, the isolation groove 50 does not pass through the buffer layer.

FIG. 5 is another cross-sectional view along a line A-A' shown in FIG. 1 according to an embodiment of the present disclosure. In another embodiment, as shown in FIG. 5, the first electrode 20 is located at a side of the substrate 40, and a sidewall of the first buffer layer 35 is in contact with a sidewall of the first electrode 20, so as to achieve the electrical connection between the first buffer layer 35 and the first electrode 20. The first buffer layers 35 of various LED chips 30 are connected to the side wall of the first electrode 20 through a side wall, so that various LED chips 30 can share the first electrode 20.

In an embodiment of the present disclosure, a shape of orthographic projections of the N LED chips on the substrate is approximately a circle or any regular polygon. FIG. 1 is a top view of the LED module. The orthographic projections of the N LED chips on the substrate have a same direction as their top-view direction. It can be seen from FIG. 1 that the shape of the orthographic projections of the N LED chips on the substrate form a substantially triangle.

Figure 6:
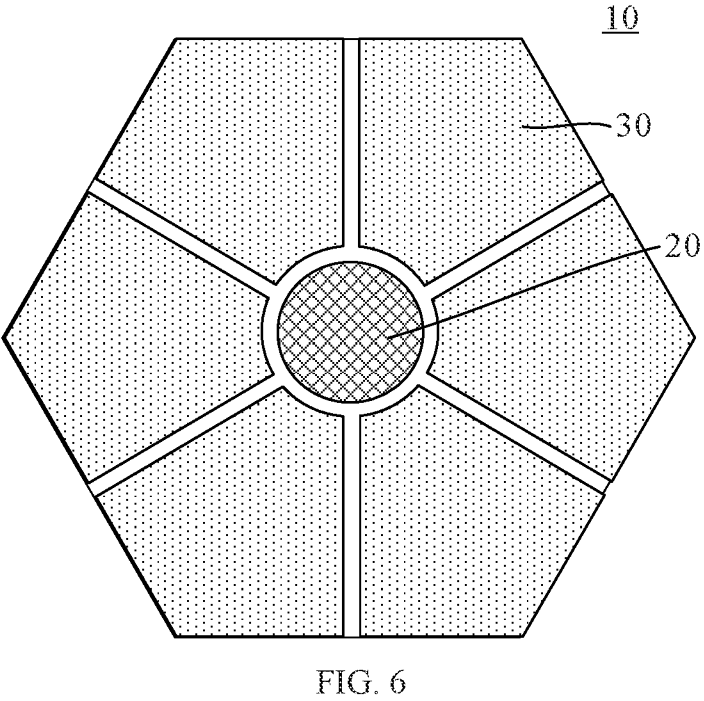
FIG. 6 is a top view of an LED module according to another embodiment of the present dis closure.

FIG. 6 is a top view of an LED module according to another embodiment of the present dis closure. In another embodiment, as shown in FIG. 6, the LED module 10 includes six LED chips 30. It can be seen from the top view of FIG. 6 that the shape of the orthographic projections of the six LED chips 30 on the substrate (not marked in FIG. 6) substantially form a hexagon. As shown in FIG. 6, the six LED chips 30 surround the first electrode 20.

Figure 7:
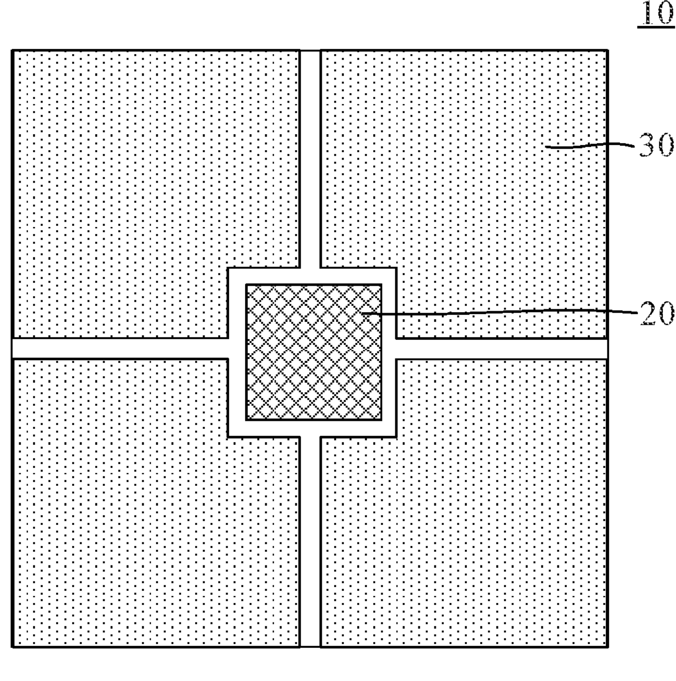
FIG. 7 is a top view of an LED module according to another embodiment of the present disclosure.

FIG. 7 is a top view of an LED module according to another embodiment of the present disclosure. In another embodiment, as shown in FIG. 7, the LED module 10 includes four LED chips 30. It can be seen from the top view of FIG. 7 that the shape of the orthographic projections of the four LED chips 30 on the substrate (not marked in FIG. 7) substantially form a quadrangle. The four LED chips 30 surround the first electrode 20.

Figures 8, 9:
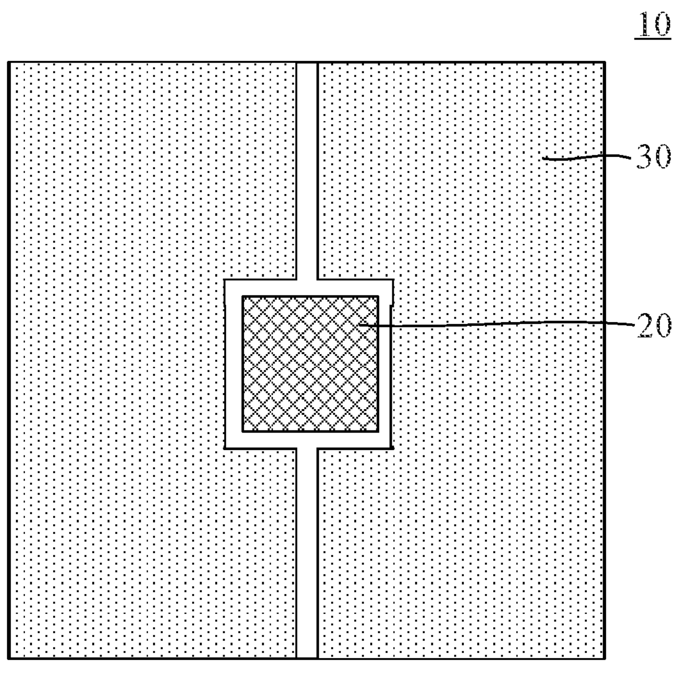
FIG. 8 is a top view of an LED module according to another embodiment of the present disclosure.
FIG. 9 is a top view of an LED module according to another embodiment of the present disclosure.

FIG. 8 is a top view of an LED module according to another embodiment of the present disclosure. In another embodiment, as shown in FIG. 8, the LED module 10 includes two LED chips 30. It can be seen from the top view of FIG. 8 that the shape of the orthographic projections of the two LED chips 30 on the substrate substantially form a quadrangle. The first electrode 20 is located at the center of the LED module, and two LED chips are equivalent to being arranged around the first electrode 20.

FIG. 9 is a top view of an LED module according to another embodiment of the present disclosure. In another embodiment, as shown in FIG. 9, the LED module 10 includes two LED chips 30. It can be seen from the top view of FIG. 9 that the orthographic projections of the two LED chips 30 on the substrate substantially form a quadrangle. The shape of the top view of the first electrode 20 is a strip shape. The two LED chips 30 are located at two sides of the first electrode 20, respectively.

Figure 10:
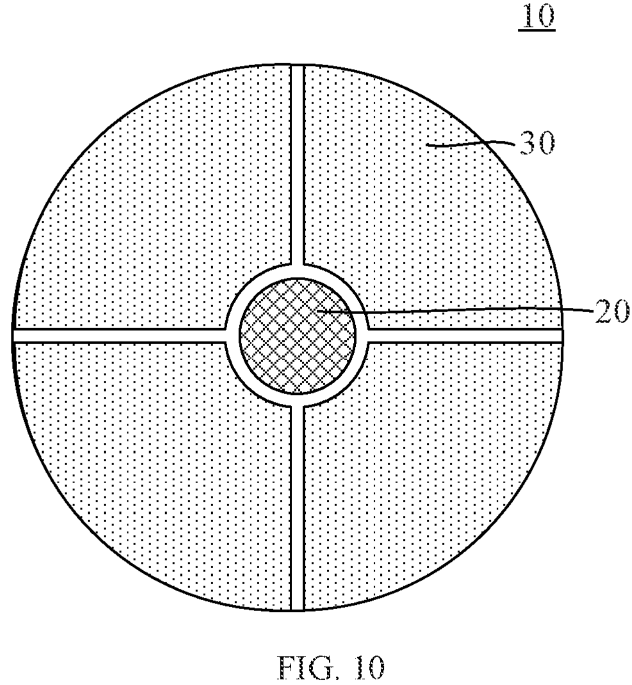
FIG. 10 is a top view of an LED module according to another embodiment of the present disclosure.

FIG. 10 is a top view of an LED module according to another embodiment of the present disclosure. In another embodiment, as shown in FIG. 10, the LED module 10 includes four LED chips 30. The orthographic projections of the four LED chips 30 on the substrate (not shown in FIG. 10) substantially form a circle. Four LED chips 30 surround the first electrode 20.

In an embodiment, the shape of the orthographic projections of the N LED chips 30 on the substrate can be substantially elliptical.

In some embodiments, the N LED chips 30 surround the first electrode 20.

Figure 11:
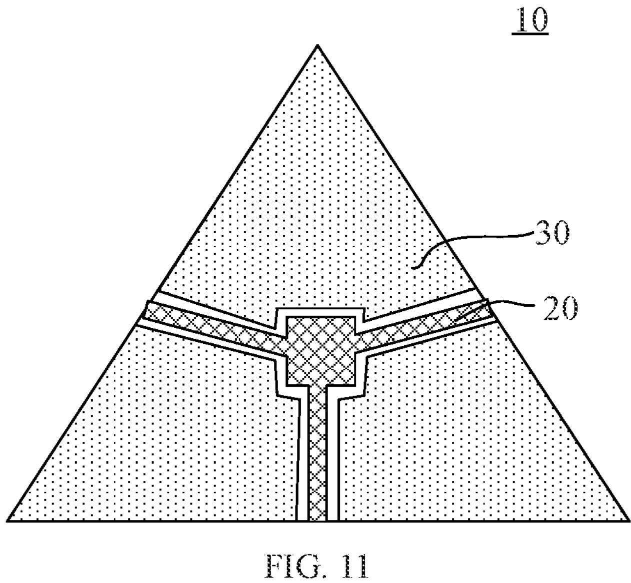
FIG. 11 is a top view of an LED module according to another embodiment of the present disclosure.

FIG. 11 is a top view of an LED module according to another embodiment of the present disclosure. In another embodiment, as shown in FIG. 11, the top view shape of the first electrode 20 is a profiled shape. A partial structure of the first electrode 20 is located between two adjacent LED chips 30. In an embodiment of the present disclosure, the shape of the first electrode 20, and the arrangement of the first electrode 20 and the LED chips 30 can be configured according to requirements, as long as the electrical connection between the first buffer layer 35 and the first electrode 20 of the LED chip 30 can be achieved so that the LED chips 30 share the first electrode 20.

In some embodiments, the LED chips of the LED module have a same size. The light-emitting layers 32 of the N LED chips 30 of the LED module 10 have a same area. That is, light-emitting regions of the LED chips 30 have a same area. When the LED module is transferred to the driving substrate to form a display panel, each LED chip 30 emits light as an independent sub-pixel. In the display panel, it is necessary to combine LED chips emitting light with different colors to form the display module. The light-emitting layers 32 of various LED chips 30 of the same one LED module have the same area. When the LED chips 30 in a same LED module belong to different display modules, the display module can use a same driving law to display grayscale brightness, thereby simplifying the display driving manner of the display panel.

In some embodiments, according to different application scenarios of the LED module, the LED chips of the LED module can have different sizes.

In the embodiments of the present disclosure, the N LED chips 30 of the LED module 10 share one first electrode 20, emit light with a same color, and are manufactured in a same process, so that the arrangement of the LED chips 30 is more compact. When being applied in the display panel, the LED module is transferred as a minimum unit in the massive transfer process. After the multiple LED modules with different light-emitting colors are transferred to the predetermined positions of the driving substrate, the LED chips with different light-emitting colors are recombined to be displayed as a display module.

Figure 12:
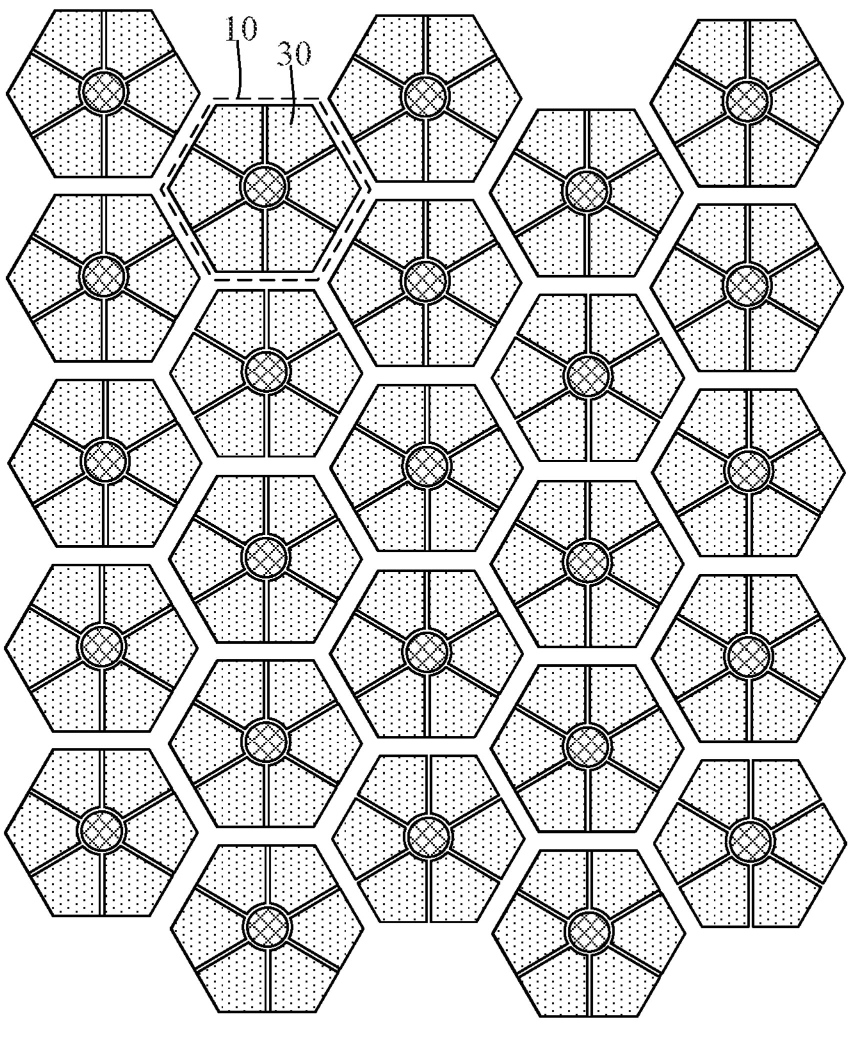
FIG. 12 is a partial schematic diagram showing an LED source substrate according to an embodiment of the present disclosure.

The present disclosure further provides an LED source substrate. The LED source substrate includes an LED module provided in any embodiment of the present disclosure. FIG. 12 is a partial schematic diagram showing an LED source substrate according to an embodiment of the present disclosure. As shown in FIG. 12, the LED source substrate includes multiple LED modules 10 of FIG. 6. The LED chips 30 in FIG. 12 emit light with a same color. Multiple LED modules 10 arranged in an array are manufactured on the same substrate to form an LED source substrate. Multiple independent LED modules 10 can be obtained by cutting along a predetermined cutting line between adjacent LED modules 10.

In one application, one LED module 10 serves as the smallest transfer unit. Multiple LED modules 10 are transferred onto a driving substrate to form a display panel.

In an embodiment, the LED chips in the LED modules 10 of the LED source substrate emit red light.

In another embodiment, the LED chips in the LED module 10 of the LED source substrate emit green light.

In another embodiment, the LED chips in the LED module 10 of the LED source substrate emit blue light.

Figure 13:
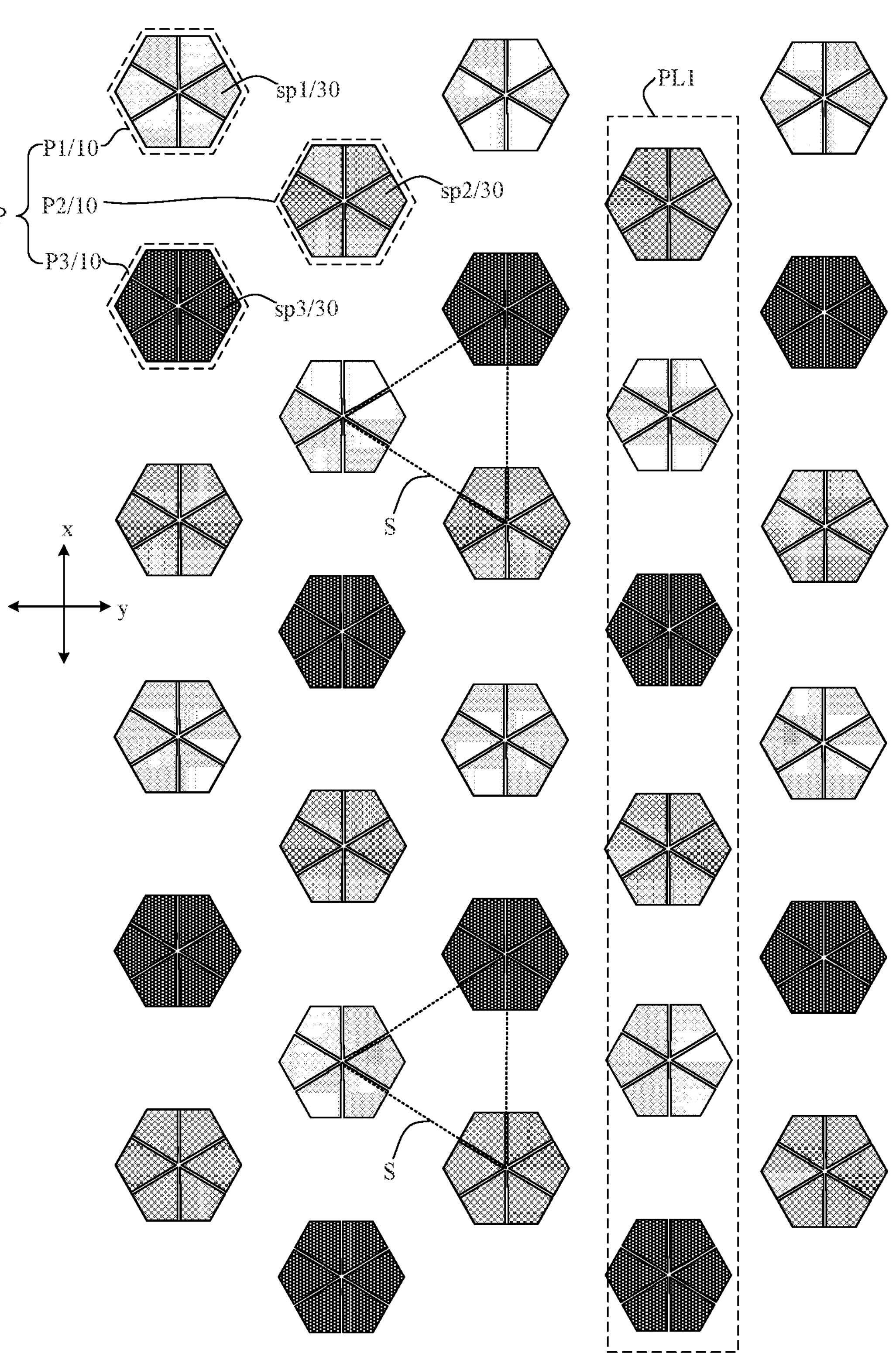
FIG. 13 is a schematic diagram showing a display panel according to an embodiment of the present disclosure.

The present disclosure further provides a display panel. FIG. 13 is a schematic diagram showing a display panel according to an embodiment of the present disclosure. As shown in FIG. 13, the display panel includes multiple pixels P. The pixel P includes a first-color pixel P1, a second-color pixel P2, and a third-color pixel P3. Each pixel P includes a LED module 10. The pixel P includes sub-pixels. The number of sub-pixels is the same as the number of LED chips 30 of the LED module 10 of the pixel P. As shown in FIG. 13, if the LED module 10 in the first-color pixel P1 includes six LED chips 30, the first-color pixel P1 includes six first sub-pixels sp1. It can be seen that the second-color pixel P2 includes six second sub-pixels sp2, and the third-color pixel P3 includes six third sub-pixels sp3.

The display panel provided by the present disclosure further includes a driving substrate. The pixels P are all located at the same side of the driving substrate. During production, multiple LED modules 10 are transferred to a predetermined position of the driving substrate, and the light-emitting colors of the multiple LED modules 10 transferred in one transfer process are the same. In the embodiments of the present disclosure, one LED module 10 includes at least two LED chips 30. The LED module 10 can be transferred as one minimum unit in the massive transfer process during production. In case that the total number of minimum units transferred for each massive transfer is fixed, the number of LED chips 30 transferred by each massive transfer can be increased. After the multiple LED modules 10 with different light-emitting colors are transferred to the driving substrate, the LED chips 30 with different light-emitting colors are recombined to be displayed as a display module. Therefore, when the number of times of transfers can be reduced without substantially affecting the display effect of the display panel, when the transfer yield is determined, the number of times of repairs to the LED can be reduced, thereby shortening production time and reducing costs.

In an embodiment of the present disclosure, the LED chips 30 of the LED module 10 share the first electrode (not shown in FIG. 13), so that the structure of the LED module 10 is more compact, thereby increasing the aperture ratio of the display panel, and further improving the light transmittance of the display panel in some applications.

In an embodiment of the present disclosure, each of the first-color pixel P1, the second-color pixel P2, and the third-color pixel P2 is one of a red pixel, a green pixel, and a blue pixel. The LED chip of the LED module 10 of the red pixel is a red LED chip, the LED chip 30 of the LED module 10 of the green pixel is a green LED chip, and the LED chip 30 of the LED module 10 of the blue pixel is a blue LED chip.

In the display panel, for one pixel; the pixels with other two different colors from this pixel are a first auxiliary pixel and a second auxiliary pixel, respectively; and in a direction surrounding the pixel, at least one first auxiliary pixel and at least one second auxiliary pixel are adjacent to the pixel. With such configuration, the sub-pixels with different light-emitting colors can be combined to form a display module. The display module is the smallest display unit that can be displayed by the display panel.

The third-color pixel P3 is taken as an example for illustration. As shown in FIG. 13, for the third-color pixel P3, the first-color pixel P1 and the second-color pixel P2 are the first auxiliary pixel and the second auxiliary pixel, respectively. The third-color pixel P3 is surrounded by three first-color pixels P1 and three second-color pixels P2. For one third sub-pixel sp3 of the third-color pixel P3, at least one first sub-pixel sp1 and at least one second sub-pixel sp2 that surrounds the third sub-pixel sp3 are adjacent to the third sub-pixel sp3, so that the closest sub-pixels with three different colors can be combined as a display module for display.

In some embodiments, as shown in FIG. 13, in a first direction x, the first-color pixel P1, the second-color pixel P2, and the third-color pixel P3 are sequentially arranged, and the first-color pixels P1, the second-color pixels P2, and the third-color pixels P3 are alternately arranged to form a first pixel column PL1. Multiple pixel columns PL1 are arranged in a second direction y. The second direction y intersects with the first direction x. The pixels P in two adjacent first pixel columns PL1 have dislocations in the second direction y. In other words, the pixels P in two adjacent first pixel columns PL1 are not aligned with each other in the second direction y. With such arrangement, the pixel with one color can be surrounded by the pixels with another two colors adjacent thereto, so that the sub-pixels of different light-emitting colors can be combined to form a display module.

The shape of the pixel P shown in FIG. 13 is a regular hexagon. Each pixel P includes six sub-pixels. In an embodiment, the size of the six sub-pixels of the pixel P is the same, that is, the area of the light-emitting layer of the six LED chips 30 of the pixel P is the same. When the LED chips 30 in the same pixel P belong to different display modules, respectively, the display modules can use the same driving law to display grayscale brightness, thereby simplifying the display driving manner of the display panel.

In an embodiment, when the display panel displays an image, one first sub-pixel sp1, one second sub-pixel sp2, and one third sub-pixel sp3 shown in FIG. 13 can be used as a display module S for display.

Figure 14:
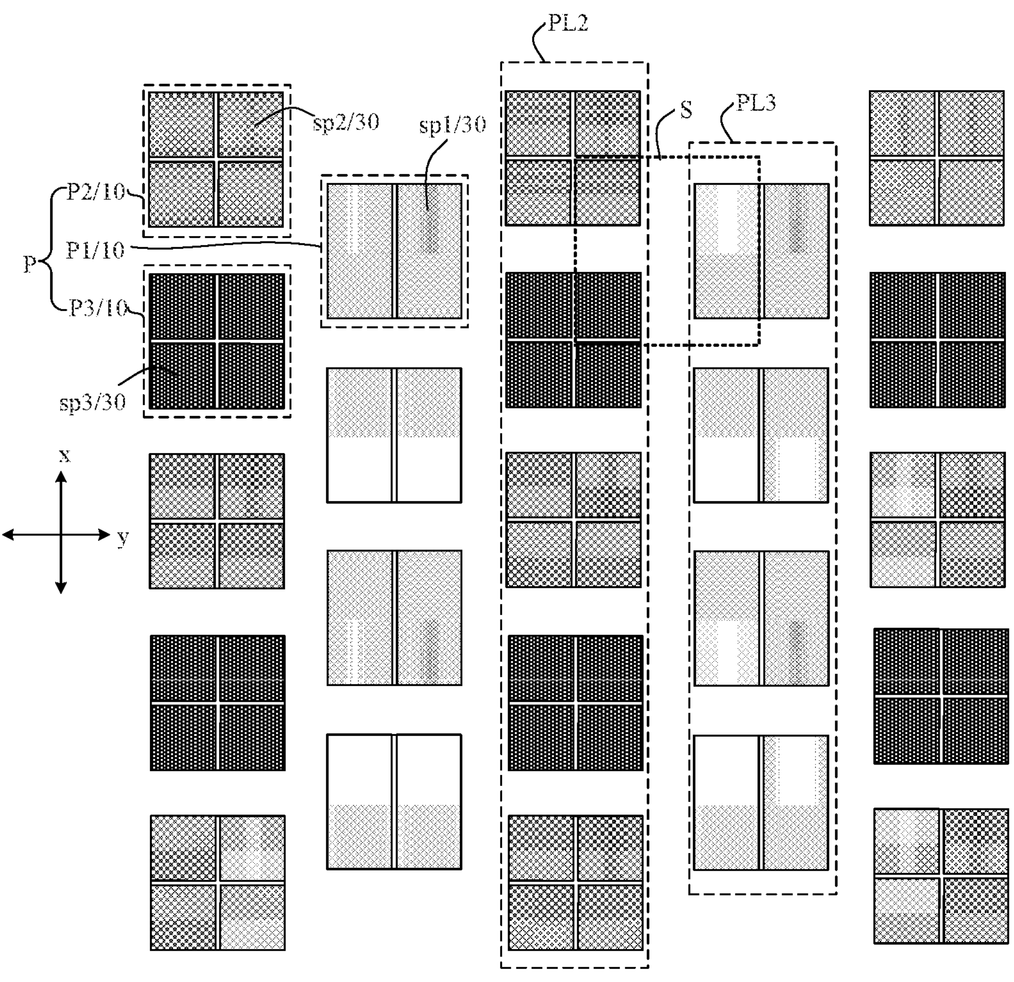
FIG. 14 is a schematic diagram showing a display panel according to another embodiment of the present disclosure.

FIG. 14 is a schematic diagram showing a display panel according to another embodiment of the present disclosure. In another embodiment, as shown in FIG. 14, in a first direction x, the first-color pixels P1 and the second-color pixels P2 are alternately arranged to form a second pixel column PL2. Multiple third-color pixels P3 are arranged to form a third pixel column PL3. In a second direction y, the second pixel column PL2 and the third pixel column PL3 are alternately arranged, and the pixels of the second pixel column PL2 and the third pixel column PL3 are staggered in the second direction y. In other words, the pixels P of the adjacent second pixel column PL2 and the third pixel column PL3 are not aligned in the second direction y. With such arrangement, the pixel with one color can be surrounded by the pixels with another two colors adjacent thereto, so that the sub-pixels of different light-emitting colors can be combined to form a display module.

As shown in FIG. 14, the shape of the pixel P is rectangular. The first-color pixel P1 includes four first sub-pixels sp1, the second-color pixel P2 includes four second sub-pixels sp2, and the third-color pixel P3 includes two third sub-pixels sp3. Each of the first-color pixel P1, the second-color pixel P2, and the third-color pixel P3 is one of a red pixel, a green pixel, and a blue pixel. In an embodiment, when the size of various sub-pixels of the pixel P is the same. When the LED chips 30 in the same pixel P belong to different display modules, respectively, the display modules can use the same driving law to display grayscale brightness, thereby simplifying the display driving manner of the display panel.

Taking the third-color pixel P3 as an example, four first-color pixels P1 and two second-color pixels P2 that surround the third-color pixel P3 are adjacent to the third-color pixel P3. For one third sub-pixel sp3, the second sub-pixel sp2 and the first sub-pixel sp1 that surround the third sub-pixel sp3 are adjacent to the third sub-pixel sp3.

In an embodiment, when the display panel displays an image, one third sub-pixel sp3 shown in FIG. 14, and one first sub-pixel sp1 and one second sub-pixel sp2 that are adjacent to the third sub-pixel sp3 form a display module S.

Figure 15:
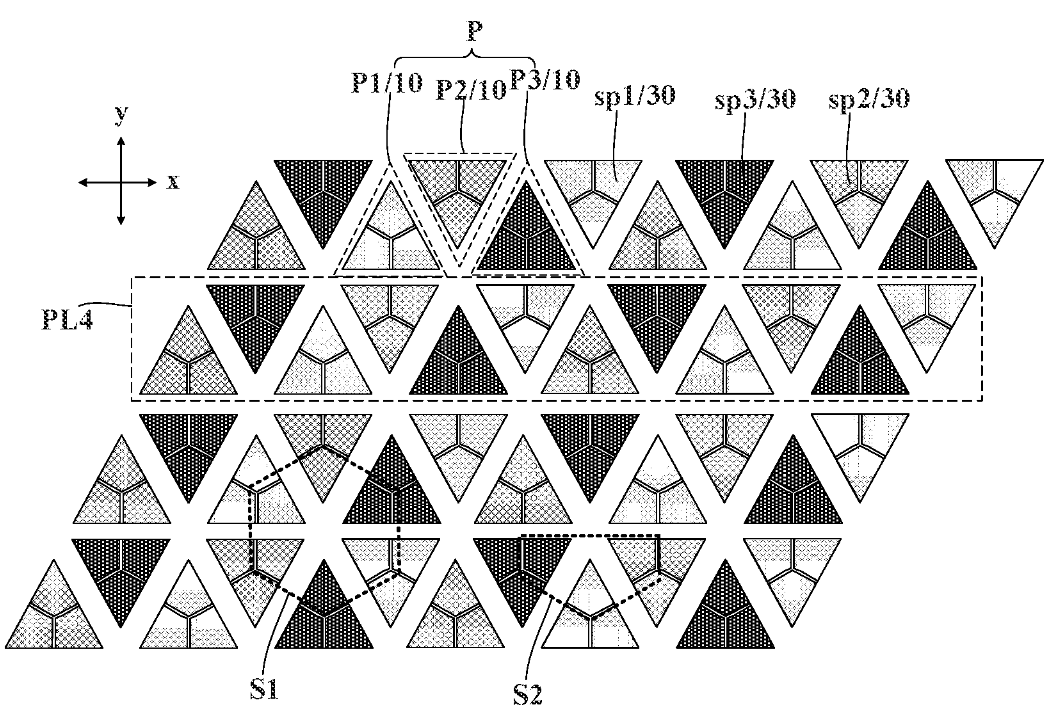
FIG. 15 is a schematic diagram showing a display panel according to another embodiment of the present disclosure.

FIG. 15 is a schematic diagram showing a display panel according to another embodiment of the present disclosure. In another embodiment, as shown in FIG. 15, the shape of the pixel P is substantially triangular, and each pixel P includes three sub-pixels. In a first direction x, the first-color pixels P1, the second-color pixels P2, and the third-color pixels P3 are alternately arranged to form a fourth pixel column PL4. In the fourth pixel column PL4, there are two adjacent pixels P, one of which is a regular triangle, and the other one of which is an inverted triangle. In a second direction y, multiple fourth pixel columns PL4 are arranged sequentially. Two sides of the two pixels P respectively belonging to two adjacent fourth pixel columns PL4 are adjacent to each other, or two vertex angles of the two pixels P respectively belonging to two adjacent fourth pixel columns PL4 are adjacent to each other. With such arrangement, one pixel with one color is surrounded by pixels with another two colors adjacent thereto, which facilitates the combination of sub-pixels with different light-emitting colors to form a display module. The arrangement of pixels in the display panel can be closer, thereby improving the aperture ratio of the display panel.

FIG. 15 shows that each pixel P includes three sub-pixels. The first-color pixel P1 includes three first sub-pixels sp1. The second-color pixel P2 includes three second sub-pixels sp2, and the third-color pixel P3 includes three third sub-pixels sp3. In an embodiment, the three sub-pixels of the pixel P have a same size, and the light-emitting layers of three LED chips 30 of the pixel P have a same size. When the LED chips 30 in the same pixel P belong to different display modules, the display modules can use the same driving law to display grayscale brightness, which can simplify the display driving manner of the display panel.

In an embodiment, when the display panel displays an image, a first display module S1 as shown in FIG. 15 is used as the smallest display unit that can be displayed in the display panel. The first display module S1 includes two first sub-pixels sp1, two second sub-pixels sp2, and two third sub-pixels sp3.

In another embodiment, when the display panel displays an image, the second display module S2 as shown in FIG. 15 is used as the smallest display unit that can be displayed in the display panel. The second display module S2 includes one first sub-pixel sp1, one second sub-pixel sp2, and one third sub-pixel sp3.

The LED modules 10 shown in FIG. 13, FIG. 14, and FIG. 15 are only a simplified illustration, and only the number and arrangement of the LED chips 30 of the LED modules 10 are shown. The position of the first electrode of the LED module 10 is not shown. The shape and position of the first electrode can be configured according to design requirements.

Figure 16:
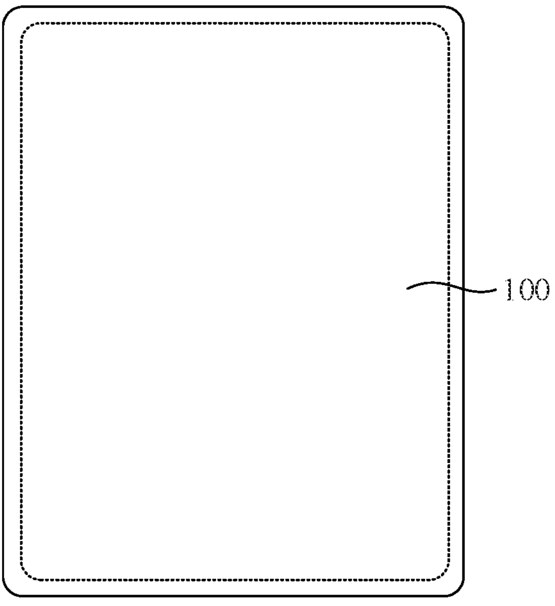
FIG. 16 is a schematic diagram showing a display apparatus according to an embodiment of the present disclosure.

The present disclosure further provides a display apparatus. FIG. 16 is a schematic diagram showing a display apparatus according to an embodiment of the present disclosure. As shown in FIG. 16, the display apparatus includes a display panel 100 provided by any embodiment of the present disclosure. The structure of the display panel 100 has been described in the above embodiments, and will not be repeated herein. In the embodiments of the present disclosure, the display apparatus can be any device with a display function, such as a mobile phone, a tablet computer, a laptop computer, an electronic paper book, a television, or a smart watch.

The above illustrates merely some embodiments of the present disclosure, which, as mentioned above, are not intended to limit the present disclosure. Within the principles of the present disclosure, any modification, equivalent substitution, improvement shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, comprising:

a plurality of pixels comprising at least one first-color pixel, at least one second-color pixel, and at least one third-color pixel, wherein at least one of the plurality of pixels comprises a light-emitting diode (LED) module, wherein the light-emitting diode (LED) module comprises N LED chips, wherein N is an integer not smaller than 2, each of the N LED chips comprises a light-emitting layer, an isolation groove is arranged between any two light-emitting layers of the N LED chips, the N LED chips share one first electrode and are arranged around the first electrode, and at least two of the N LED chips each comprise a second electrode; and the at least one of the plurality of pixels comprises a plurality of sub-pixels, and a number of the plurality of sub-pixels is equal to N.

2. The display panel according to claim 1, wherein for one pixel of the plurality of pixels:

two pixels of the plurality of pixels with other two different colors from the one pixel are one of at least one first auxiliary pixel and one of at least one second auxiliary pixel, respectively, and at least one of the at least one first auxiliary pixel and at least one of the at least one second auxiliary pixel are adjacent to the one pixel in a direction surrounding the one pixel.

3. The display panel according to claim 2, wherein the plurality of pixels comprises at least two first-color pixels, at least two second-color pixels, and at least two third-color pixels, wherein one of the at least two first-color pixels, one of the at least two second-color pixels, and one of the at least two third-color pixels are sequentially arranged in a first direction; at least two of the at least two first-color pixels, at least two of the at least two second-color pixels, and at least two of the at least two third-color pixels are alternatively arranged in the first direction to form one of first pixel columns; the first pixel columns are arranged in a second direction intersecting with the first direction; and two of the plurality of pixels that are respectively located in two adjacent first pixel columns of the first pixel columns are staggered in the second direction.

4. The display panel according to claim 3, wherein one of the plurality of pixels has a regular hexagon shape, and at least one of the plurality of pixels comprises six sub-pixels.

5. The display panel according to claim 2, wherein the at least one first-color pixel comprises at least two first-color pixels, the at least one second-color pixel comprises at least two second-color pixels, and the at least one third-color pixel comprises at least two third-color pixels; at least two of the at least two first-color pixels and at least two of the at least two second-color pixels are arranged in a first direction in a staggered manner to form one of second pixel columns, and at least two of the at least two third-color pixels are arranged in the first direction to form one of third pixel columns; and the second pixel columns and the third pixel columns are alternately arranged in a second direction, and one of the plurality of pixels in one of the second pixel columns and another one of the plurality of pixels in one of the third pixel columns that is adjacent to the second pixel column are staggered in the second direction.

6. The display panel according to claim 5, wherein one of the plurality of pixels has a rectangle shape, one of the at least one first-color pixels and one of the at least one second-color pixels each comprise four sub-pixels, and one of the at least one third-color pixels comprises two sub-pixels.

7. The display panel according to claim 2, wherein one of the plurality of pixels has a triangle shape, and at least one of the plurality of pixels comprises three sub-pixels;

the at least one first-color pixel comprises at least two first-color pixels, the at least one second-color pixel comprises at least two second-color pixels, and the at least one third-color pixel comprises at least two third-color pixels, wherein one of the at least two first-color pixels, one of the at least two second-color pixels, and one of the at least two third-color pixels are sequentially arranged in a first direction; at least two of the at least two first-color pixels, at least two of the at least two second-color pixels, and at least two of the at least two third-color pixels are alternatively arranged in the first direction to form one of fourth pixel columns; one of two adjacent pixels of the plurality of pixels in one of the fourth pixel columns has a regular triangle shape, and the other one of the two adjacent pixels has an inverted triangle shape; and the fourth pixel columns are arranged sequentially in a second direction; and a side of one of the plurality of pixels in one fourth pixel column of the fourth pixel columns is adjacent to a side of another one of the plurality of pixels in another one of the fourth pixel columns that is adjacent to the one fourth pixel column, or a vertex angle of one of the plurality of pixels in a first one of the fourth pixel columns is adjacent to a vertex angle of another one of the plurality of pixels in a second one of the fourth pixel columns that is adjacent to the first one of the fourth pixel columns.

8. The display panel according to claim 1, wherein one of the at least one first-color pixel, one of the at least one second-color pixel, and one of the at least one third-color pixel are a red pixel, a green pixel, and a blue pixel, respectively.

9. A display apparatus, comprising the display panel according to claim 1.

10. The display panel according to claim 1, wherein the LED module further comprises a base, wherein the N LED chips are located at a side of the base; and each of the N LED chips comprises a first buffer layer, the light-emitting layer, and the second electrode that are sequentially arranged away from the base, wherein the first electrode is electrically connected to the first buffer layer.

11. The display panel according to claim 10, wherein the LED module further comprises a common buffer layer located at a side of the base, wherein the first electrode is in contact with a surface of the common buffer layer facing away from the base; and the first buffer layers of the N LED chips are all connected to the common buffer layer.

12. The display panel according to claim 11, wherein the first buffer layer and the common buffer layer are formed into one piece.

13. The display panel according to claim 10, wherein the first electrode is located at the side of the base, and a sidewall of the first buffer layer is in contact with a sidewall of the first electrode.

14. The display panel according to claim 10, wherein an isolation groove is formed between two adjacent LED chips of the N LED chips; and the first buffer layer at least partially does not overlap with the isolation groove in a direction perpendicular to a plane of the base.

15. The display panel according to claim 10, wherein an orthographic projection of the first buffer layer of one of the N LED chips on the base surrounds an orthographic projection of the first electrode on the base.

16. The display panel according to claim 10, wherein the light-emitting layers of the N LED chips have a same area.

17. The display panel according to claim 1, wherein the N LED chips emits light of a same color.

18. The display panel according to claim 1, wherein orthographic projections of the N LED chips on the base have a circle shape or a regular polygon shape.

* * * * *